(12) United States Patent
Lin et al.

(10) Patent No.: US 9,157,463 B2
(45) Date of Patent: Oct. 13, 2015

(54) HANGING STRUCTURE AND CASE USING THE SAME

(71) Applicants: Inventec (Pudong) Technology Corporation, Shanghai (CN); INVENTEC CORPORATION, Taipei (TW)

(72) Inventors: Yu-Huan Lin, Taipei (TW); Lin-Wei Chang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 14/243,657

(22) Filed: Apr. 2, 2014

(65) Prior Publication Data

US 2015/0152903 A1 Jun. 4, 2015

(30) Foreign Application Priority Data

Nov. 29, 2013 (CN) .......................... 2013 1 0630113

(51) Int. Cl.
*A47K 1/00* (2006.01)
*F16B 12/10* (2006.01)
*A47G 29/00* (2006.01)
*F16B 45/00* (2006.01)
*F16M 13/02* (2006.01)

(52) U.S. Cl.
CPC ................ *F16B 12/10* (2013.01); *A47G 29/00* (2013.01); *F16B 45/00* (2013.01); *F16M 13/02* (2013.01)

(58) Field of Classification Search
USPC .......... 248/220.31, 220.41, 225.21, 235, 241, 248/243, 250; 211/106.01, 207
See application file for complete search history.

(56) References Cited

U.S. PATENT DOCUMENTS

| | | | | | |
|---|---|---|---|---|---|
| 4,662,592 | A | * | 5/1987 | Garfinkle | ................. 248/220.42 |
| 6,315,489 | B1 | * | 11/2001 | Watanabe | ..................... 403/381 |
| D650,264 | S | * | 12/2011 | Smalley | ........................ D8/381 |
| 2003/0071181 | A1 | * | 4/2003 | Valiulis et al. | ........... 248/220.43 |
| 2003/0164432 | A1 | * | 9/2003 | Shea | ....................... 248/220.31 |

\* cited by examiner

*Primary Examiner* — Steven Marsh
(74) *Attorney, Agent, or Firm* — Locke Lord LLP; Tim Tingkang Xia, Esq.

(57) ABSTRACT

A hanging structure includes a main body, two first hooks and a second hook. The main body has an outer surface, and the outer surface has a first end. The two first hooks are disposed on the first end. The second hook is disposed on the first end. The second hook is located between the two first hooks, and the length of the part of each of the two first hooks above the outer surface is longer than the length of the part of the second hook above the outer surface.

5 Claims, 4 Drawing Sheets

HANGING STRUCTURE AND CASE USING THE SAME

CROSS-REFERENCE TO RELATED APPLICATIONS

This non-provisional application claims priority under 35 U.S.C. §119(a) on Patent Application No(s). 201310630113.5 filed in China, P.R.C. on Nov. 29, 2013, the entire contents of which are hereby incorporated by reference.

BACKGROUND OF THE INVENTION

1. Technical Field of the Invention

The disclosure relates to a hanging structure, more particularly to a hanging structure applicable for holes in different shapes.

2. Description of the Related Art

Nowadays a case comprises a large number of components and the internal configuration of the case is very complicated. Thus, the installation of these components is time-consuming.

In the structural design of the case, the components inside thereof are often connected with each other by hanging them on a rack. Typically, when an object is required to be hung on a hanging rack, a hanging structure is hung on a hole of a hanging rack before fix the object to the hanging structure. However, the shapes of the holes of the hanging racks are different from each other, while today's hanging structure can only correspond to one certain shape of the hole. For example, the hanging structure configured for the rectangular holes cannot be hung on the round holes. As a result, the hanging structure often needs to be replaced, which leads to the additional cost. Therefore, it is important to design a hanging structure suitable for different shapes of holes, especially for the most common holes, namely rectangular holes and round holes.

SUMMARY OF THE INVENTION

A hanging structure comprises a main body, two first hooks and a second hook. The main body has an outer surface, and the outer surface has a first end. The two first hooks are disposed on the first end. The second hook is disposed on the first end. The second hook is located between the two first hooks, and the length of the part of each of the two first hooks above the outer surface is longer than the length of the part of the second hook above the outer surface.

A case comprises a hanging structure and a hanging rack. The hanging structure comprises a main body, two first hooks and a second hook. The main body has an outer surface, and the outer surface has a first end. The two first hooks are disposed on the first end. The second hook is disposed on the first end. The second hook is located between the two first hooks, and the length of the part of each of the two first hooks above the outer surface is longer than the length of the part of the second hook above the outer surface. The hanging rack has at least one rectangular hole, and the two first hooks are fastened with the at least one rectangular hole.

A case comprises a hanging structure and a hanging rack. The hanging structure comprises a main body, two first hooks and a second hook. The main body has an outer surface, and the outer surface has a first end. The two first hooks are disposed on the first end. The second hook is disposed on the first end. The second hook is located between the two first hooks, and the length of the part of each of the two first hooks above the outer surface is longer than the length of the part of the second hook above the outer surface. The hanging rack has an inner surface and at least one round hole formed on the inner surface. The second hook is fastened with the at least one round hole, and the two first hooks are elastically deformed and lean on the inner surface.

BRIEF DESCRIPTION OF THE DRAWINGS

The present disclosure will become more fully understood from the detailed description given hereinbelow, along with the accompanying drawings which are for illustration only, thus are not limitative of the present disclosure, and wherein.

DETAILED DESCRIPTION

Figure 1:
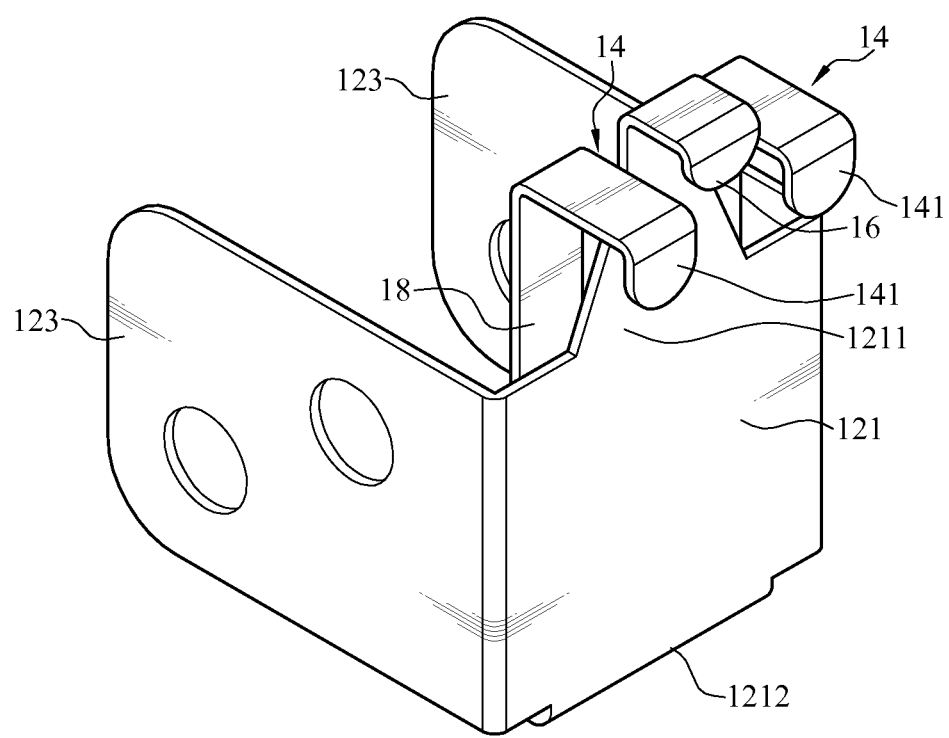
FIG. 1 is a perspective view of a hanging structure according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
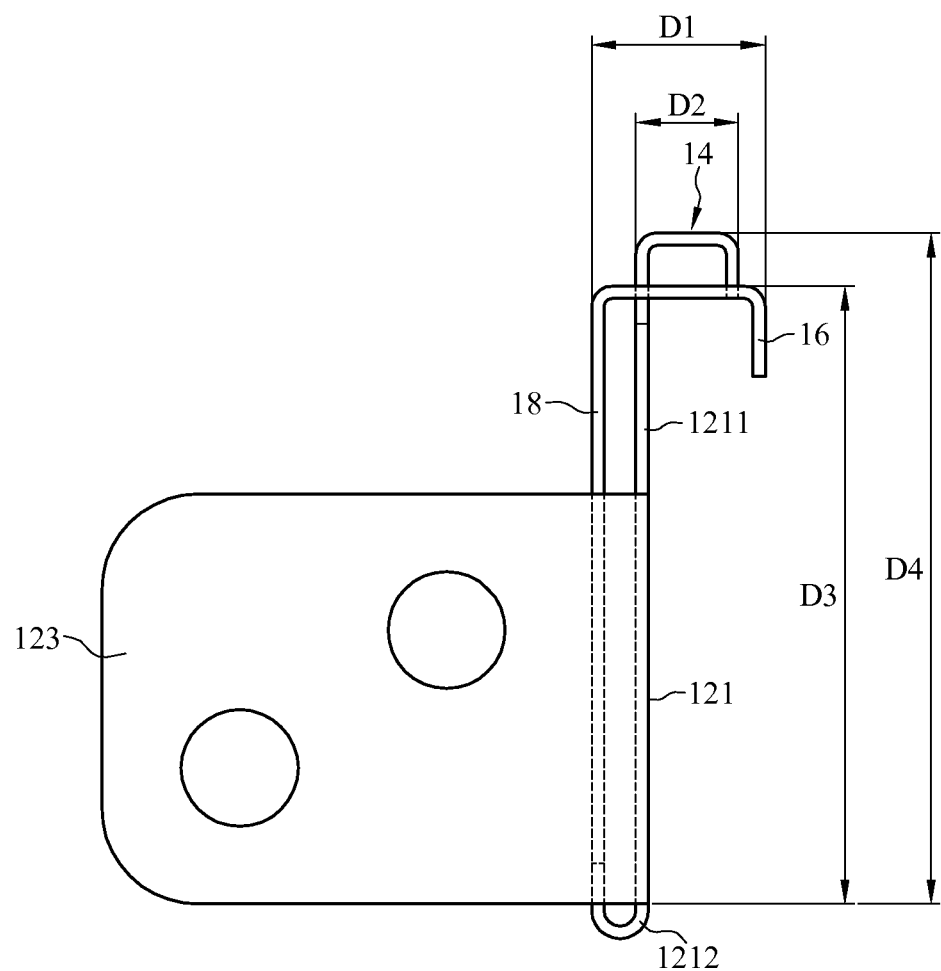
FIG. 2 is a side view of FIG. 1.

FIG. 1 is a perspective view of a hanging structure according to the first embodiment of the disclosure; FIG. 2 is a side view of FIG. 1. As seen in FIG. 1 and FIG. 2, the hanging structure 10 comprises a main body 12 and the main body 12 has an outer surface 121. The outer surface 121 has a first end 1211 and a second end 1212 opposite to each other. Two first hooks 14 and a second hook 16 are disposed on the first end 1211, and the second hook 16 is located between the two first hooks 14. Each first hook 14 has a hook portion 141 and an elastic arm 18. In this embodiment, the two elastic arms 18 are integrally folded at the second end 1212 and extend to the first end 1211, but the disclosure is not limited thereto. In other embodiments, the two elastic arms may extend from the first end 1211. The two hook portions are connected to the two elastic arms 18 respectively. In this embodiment, the two hook portions 141 integrally extend from the two elastic arms 18 respectively, but the disclosure is not limited thereto. In other embodiments, the hook portion 141 and the elastic arm 18 can be two separated components which are fixed to each other. In this embodiment, the second hook 16 integrally extends from the first end 1211, but it is not limited thereto.

The length of the part of each of the two first hooks 14 above the outer surface 121 is longer than the length of the part of the second hook 16 above the outer surface 121. Specifically, the length of the end of the first hook 14, away from the outer surface 121, to the outer surface is D1, while that of the end of the second hook 16, away from the outer surface 121, to the outer surface is D2. As shown in FIG. 2, D1 is greater than D2.

In this embodiment, the distance D3 between the first hook 14 and the second end 1212 is greater than the distance D4 between the second hook 16 and the second end 1212 (as shown in FIG. 2), but the disclosure is not limited thereto.

Figure 3:
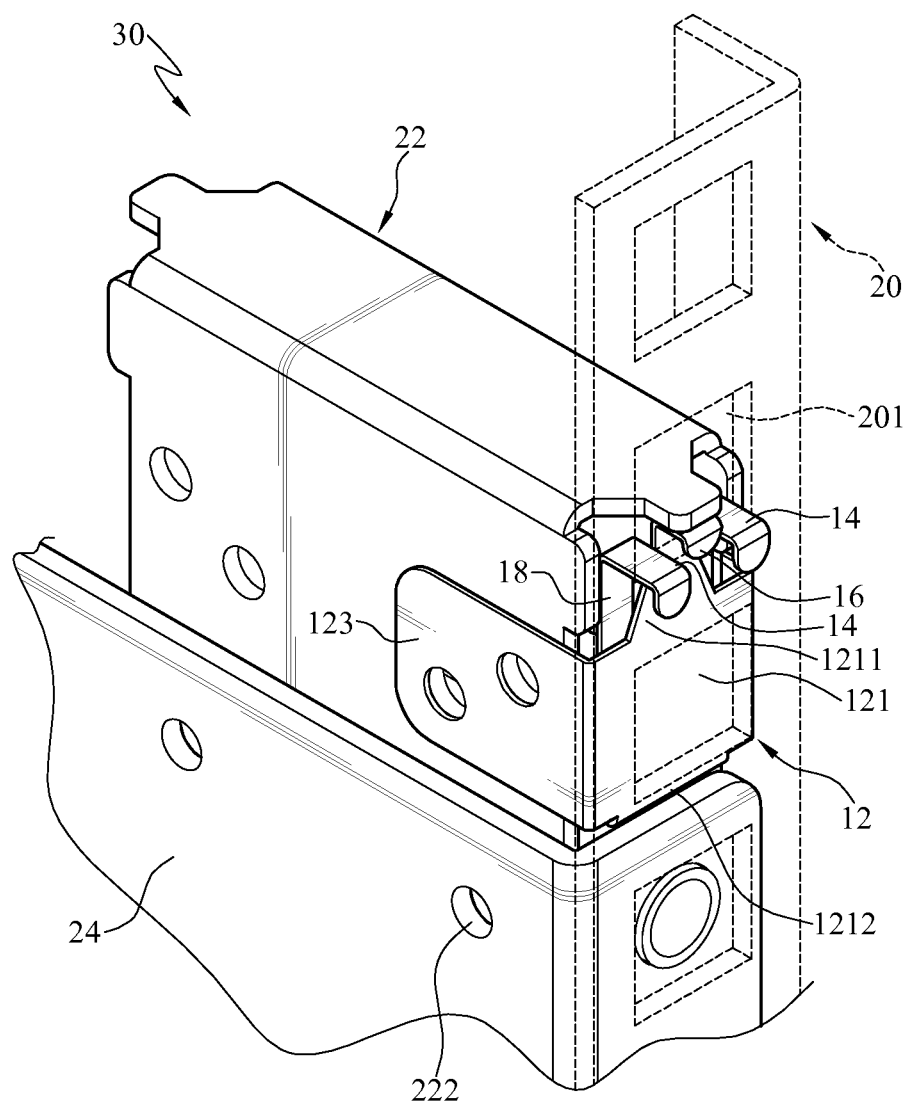
FIG. 3 is a perspective view of a case using a hanging structure according to a second embodiment of the disclosure.

FIG. 3 is a perspective view of a case using the hanging structure according to a second embodiment of the disclosure. As seen in FIG. 3, the case 30 comprises the hanging structure 10 of the first embodiment, a hanging rack 20, a connection member 22 and a support rack 24.

In this embodiment, the main body 12 further has two connection sections 123 respectively located on the opposite two sides of the outer surface 121. However, in other embodiments, the main body 12 may only have one connection section 123 located on one side of the outer surface 121. The connection member 22 is fixed to the connection section 123 and has a fixing portion 222 via a screw (not shown in the figures). The support rack 24 is fixed to the fixing portion 222 via a screw (not shown in the figures). Thereby, the hanging structure 10, the connection member 22 and the support rack 24 are connected together, so that the connection member 22 and the support rack 24 can be hung on the hanging rack 20 via the hanging structure 10.

Now the method for hanging the hanging structure 10 to the hanging rack 20 will be illustrated herein. The hanging rack 20 has at least one rectangular hole 201. When the users want to hang the hanging structure 10 on the hanging rack 20, all they need is to fasten the two first hooks 14 with the rectangular hole 201.

Figure 4:
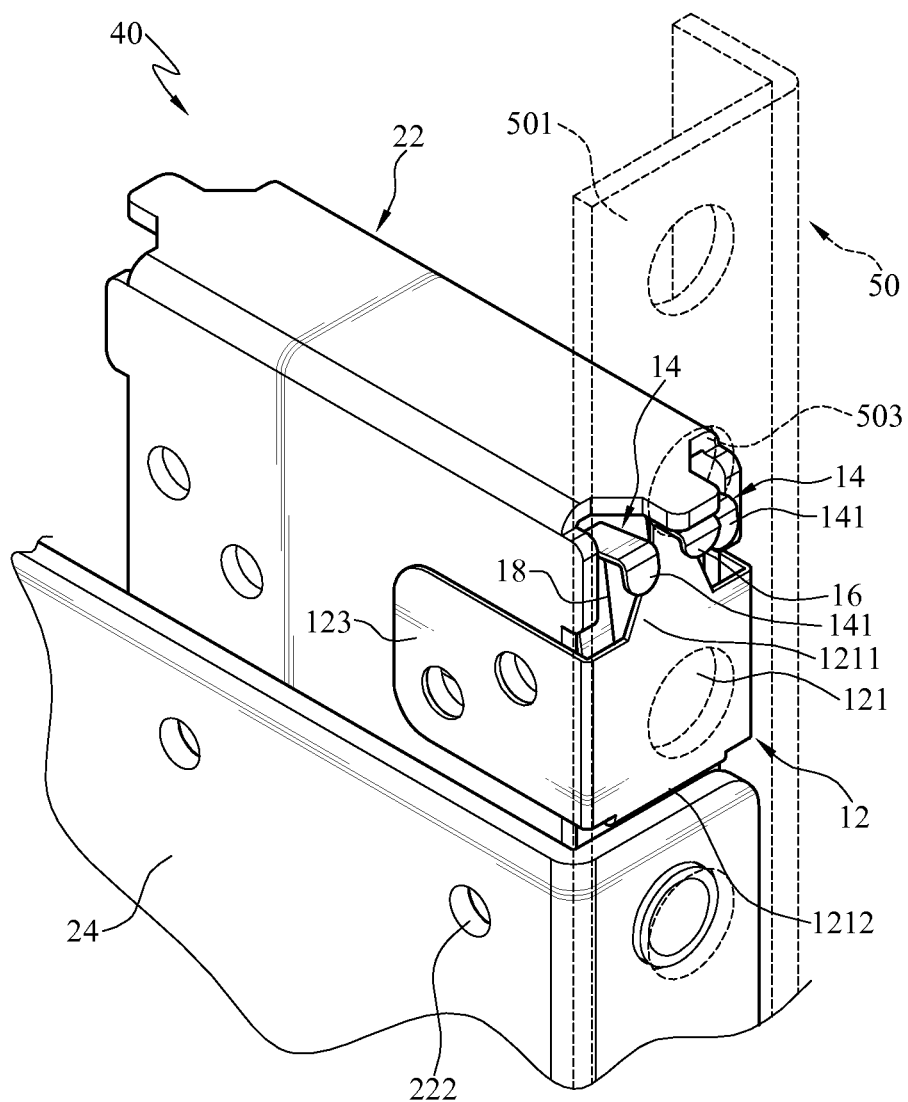
FIG. 4 is a perspective view of a case using a hanging structure according to a third embodiment of the disclosure.

FIG. 4 is a perspective view of a case using the hanging structure according to a third embodiment of the disclosure. As seen in FIG. 4, the case 40 comprises a hanging structure 10 of the first embodiment, a hanging rack 50, a connection member 22 and a support rack 24. In this embodiment, the main body 12 further has two connection sections 123 respectively located on the opposite two sides of the outer surface 121. However, in other embodiments, the main body 12 may only have one connection section 123 located on one side of the outer surface 121. The connection member 22 is fixed to the connection section 123 via a screw (not shown in the figures) and has a fixing portion 222. The support rack 24 is fixed to the fixing portion 222 via a screw (not shown in the figures). Thereby, the hanging structure 10, the connection member 22 and the support rack 24 are connected together, so that the connection member 22 and the support rack 24 can be hung on the hanging rack 50 via the hanging structure 10.

Now the method for hanging the hanging structure 10 to the hanging rack 50 will be illustrated herein. The hanging rack 50 has an inner surface 501 and at least one round hole 503 penetrating the inner surface 501. When the users want to hang the hanging structure 10 on the hanging rack 50, all they need is to align the second hook 16 with the round hole 503 and fasten them with each other. The length D1 of the part of each of the two first hooks 14 above the outer surface 121 is longer than the length D2 of the part of the second hook 16 above the outer surface 121. Thereby, during this process, the two first hooks 14 are extruded by the inner surface 501 so that the two elastic arms 18 are elastically deformed. Hence, when the second hook 16 is fastened with the round hole 503, the two elastic arms 18 are elastically deformed and this make the hook portions 141 push the inner surface 501. As a result, the second hook 16 is firmly fastened with the round hole 503 so the connection of the hanging structure 10 and the hanging rack 50 is fixedly secured.

To sum up, in the hanging structure and the case mentioned above, the hanging structure comprises two first hooks and one second hook. In addition, the length of the part of each of the two first hooks above the outer surface is longer than the length of the part of the second hook above the outer surface. Thereby, this hanging structure can be hung on the rectangular hole or the round hole. Additionally, when the hanging structure is hung on the hanging rack with the round hole, the two first hooks are elastically deformed and push the hanging rack, so the connection between the hanging structure and the hanging rack is fixedly secured.

What is claimed is:

1. A hanging structure, comprising:
a main body having an outer surface, and the outer surface having a first end and a second end which is located on one side of the main body and away from the first end;
two first hooks disposed on the first end, wherein each of the two first hooks further comprises a hook portion and an elastic arm, the elastic arm is integrally folded on the second end and extends to the first end, the hook portion is connected to the elastic arm; and
a second hook disposed on the first end, wherein the second hook is located between the two first hooks and integrally extends from the first end, and a length of a part of each of the two first hooks above the outer surface is longer than a length of a part of the second hook above the outer surface.

2. The hanging structure according to claim 1, wherein a distance between the second hook to the second end is greater than a distance between each of the two first hooks to the second end.

3. A case comprising:
a hanging structure comprising:
a main body having an outer surface, and the outer surface having a first end and a second end which is located on one side of the main body and away from the first end;
two first hooks disposed on the first end, wherein each of the two first hooks further comprises a hook portion and an elastic arm, the elastic arm is integrally folded on the second end and extends to the first end, the hook portion is connected to the elastic arm; and
a second hook disposed on the first end, wherein the second hook is located between the two first hooks and integrally extends from the first end, and a length of a part of each of the two first hooks above the outer surface is longer than a length of a part of the second hook above the outer surface;
a hanging rack having an inner surface and at least one round hole formed on the inner surface, wherein the second hook is fastened with the at least one round hole, and the two first hooks are elastically deformed and lean on the inner surface.

4. The case according to claim 3, further comprising a connection member, wherein the main body further has a connection section located on one side of the outer surface, and the connection member is fixed to the connection section.

5. The case according to claim 4, further comprising a support rack, wherein the connection member further has a fixing portion and the support rack is fixed to the fixing portion.

* * * * *